United States Patent [19]

Heerman

[11] Patent Number: 4,985,600
[45] Date of Patent: Jan. 15, 1991

[54] PRINTED CIRCUIT BOARD HAVING AN INJECTION MOLDED SUBSTRATE

[75] Inventor: Marcel Heerman, Merelbeke, Belgium

[73] Assignee: Siemens Aktiengesellschaft, Berlin and Munich, Fed. Rep. of Germany

[21] Appl. No.: 406,551

[22] Filed: Sep. 13, 1989

[30] Foreign Application Priority Data

Sep. 30, 1988 [DE] Fed. Rep. of Germany ....... 3833297

[51] Int. Cl.$^5$ .......................... H05K 1/00; H05K 3/10
[52] U.S. Cl. ...................................... 174/255; 29/849;
29/852; 174/261; 174/266
[58] Field of Search ............... 174/250, 255, 261, 266;
29/848, 849, 852; 361/419

[56] References Cited

U.S. PATENT DOCUMENTS

| | | | |
|---|---|---|---|
| 4,363,930 | 12/1982 | Hoffman | 174/255 |
| 4,374,457 | 2/1983 | Wiech, Jr. | 29/848 X |
| 4,402,135 | 9/1983 | Schweingruber et al. | 174/250 X |
| 4,510,347 | 4/1985 | Wiech, Jr. | 174/255 |
| 4,532,152 | 7/1985 | Elarde | 29/848 X |
| 4,604,799 | 8/1986 | Gurol | 427/97 X |

FOREIGN PATENT DOCUMENTS 1075825 4/1980 Canada .
2715875 4/1976 Fed. Rep. of Germany .

Primary Examiner—Morris H. Nimmo
Attorney, Agent, or Firm—Hill, Van Santen, Steadman & Simpson

[57] ABSTRACT

A printed circuit board includes an injection molded substrate having a pattern recessed in the substrate surface of interconnect traces, through-connections and contact rods. A trench-shaped depression is provided in the substrate surface in the region of each interconnect trace, and a planar depression is provided in the substrate surface in at least one of (a) the region of each through-connection and (b) the region of each contact surface. The pattern of recesses is covered with a conductive metal coat, and the width of each trench-shaped depression is dimensioned narrowly in comparison of the width of each planar depression, so that the metal coat fills the trench-shaped depressions to the surface of the substrate, while in the planar depressions a distance remains between the metal coat and the surface of the substrate. A solder stop lacquer can then be applied, such as by roller coating, without the necessity of photo-structuring and without filling the planar depressions.

14 Claims, 2 Drawing Sheets

PRINTED CIRCUIT BOARD HAVING AN INJECTION MOLDED SUBSTRATE

BACKGROUND OF THE INVENTION

The subject matter of the present application is related to an application entitled "Printed Circuit Board Having An Injection Molded Substrate" naming Hans Schmidt as the inventor, and assigned to the same assignee as the present application, identified as U.S. Ser. No. 388,818, filed Aug. 3, 1989.

The present invention relates to a printed circuit board having an injection mold substrate whose surface interconnect pattern is comprised of trench-shaped depressions in the region of interconnected traces and by planar depressions, in the region of through connection and/or connecting racks. The recessed regions have a conductive metal coat.

As will be understood by those skilled in the art, the term interconnect pattern refers to all of the electrically conductive structures which are utilized on a PC board. The term "interconnect trace" refers to the conductive path which extends between any two connection points on the board. The term "through-connections", as used herein, refers to two types of printed circuit board structures. The first structure relates to the metalized holes which connect the conductor paths of one wiring level of the PC board to another wiring level. THe second structure referred to as a "through connection" is the metalized hole which is sued to accept a component, such as a resistor lead or an integrated circuit pin, therein. Finally, the term "connecting pad" refers to the planar areas of the circuit pattern which serve, for example, for the connection of components or connecting wires.

These terms have been defined for clarification purposes only. However, the definitions set forth are not meant to be all inclusive. Accordingly, the terms should be accorded their full scope as they would be understood by those skilled in the art.

Printed circuit boards having an injection molded substrate or a similarly formed substrate are disclosed in DE-A-27 15 875 and the corresponding CA-A-107 58 25, and in U.S. Pat. No. 4,532,152.

In order to manufacture the printed circuit boards disclosed, for example, in DE-A-27 15 875, the substrate is first developed into a form in which the interconnect traces and the through-connecting holes are contained in the shape of depressions. After mechanical and/or chemical surface treatment, the substrate is then chemically activated. Once this has occurred, the raised surfaces of the substrate are covered by a protective layer. Only depressions have to remain free during the application of this protective layer. Therefore, it is no longer necessary to have an involved photo-structuring of the resist but rather the application can be done, for example, with a doctor or by roller coating. A conductive metal coat is then applied. The metal coat is preferably done by currentless metal deposition. The metal coat leads to the formation of the entire conductor configuration in the depressions of the substrate and in the through-connection holes. Finally, a solder stop lacquer is applied on the conductor surfaces which are not invalued in any solder connections.

By structuring the substrate before the selected metallization, the corresponding resist does not need photostructuring. In contrast, the application of the solder stop lacquer, requires either a selective application onto the interconnects or a photostructuring. One of these two methods are required since the planar depressions, which surround the through-contactings as solder eyes or which serve as a connecting surfaces, must remain free.

SUMMARY OF THE INVENTION

The present invention provides a printed circuit board having an injection molded substrate wherein the application of the solder stop lacquer can be done simply and without photo-structuring. The present invention accomplishes this object by having the planar depressions deeper than the trench-shaped depressions and by having the metal coat in the trench-shape depressions be at least as high as the surface of the substrate.

To this end, the present invention includes a printed circuit board in the form of an injection molded substrate. The substrate's surface has an interconnect pattern comprised of trench-shaped depressions in the region of the interconnected traces and by planar depressions in the region of through connections and connecting pads. These recessed regions have a conducting metal coat. The width (b) of the trench-shaped depressions is dimensioned narrowly and the width (B) of the planar depressions is dimensioned wide, so that the applied metal coat fills the trench-shaped depressions to the surface of the substrate while leaving the planar depressions with some distance between the metal coat and the surface of the substrate. In one embodiment, the planar depressions of the printed circuit board are located in the region of the through-connections or the region of the connecting surfaces.

In another embodiment, the metal coat in the planar depressions region is coated with a tin layer applied by hot-tinning.

In a further embodiment the metal coat is formed by chemically applied copper.

In a still further embodiment, the trench-shaped depressions have an approximately V-shaped cross section.

Additional features and advantages of the present invention are described in, and become apparent from, the detailed description of the presently preferred embodiments.

DETAILED DESCRIPTION OF THE PREFERRED EMBODIMENTS

The present invention provides a printed circuit board having an injection molded substrate, the surface of the substrate having an interconnect pattern which is comprised of trench-shaped depressions in the region of the interconnect traces and by planar depressions in the region of the through-connections and/or connecting pads. There is a conductive metal coat in the recessed regions.

The present invention is based on the perception that in a substrate with a geometry which has narrow, trench-shaped depressions, those depressions will fill, starting from the base and the side walls, by a currentless deposition of a metal coat or by a currentless and voltaic deposition of a metal coat. The deposition of the metal coat will continue until the trench-shaped depressions are completely filled. When the trench-shaped depressions are completely filled, the dimensionally wide planar depressions will have a metal coat with a thickness so that it will not fill the planar depression to the substrate surface and will also not lead to filling in the lateral wall region. By having such a geometry, the interconnect traces are reliably protected in a planar application by the solder stop lacquer with, for example, a doctor or by roller coating. Furthermore, the planar depressions, that are to form the solder eyes of the through connections or connecting pads, remain free and, in particular, can be coated, along with the walls of the through-connection holes, with a solder layer by hot tin-plating.

In the present invention, the metal coat is preferably executed by chemically applied copper, that is coated with a suitable solder layer, particularly tin, to the area of the solder eyes, the connecting pads, and the through-connection holes. A further, development of the present invention is that the trench-shaped depressions have at approximately V-shaped cross-section. A V-shaped cross section promotes the filling of the trench-shaped depressions in the currentless metal depositions or the currentless and voltaic metal deposition.

Figure 1:
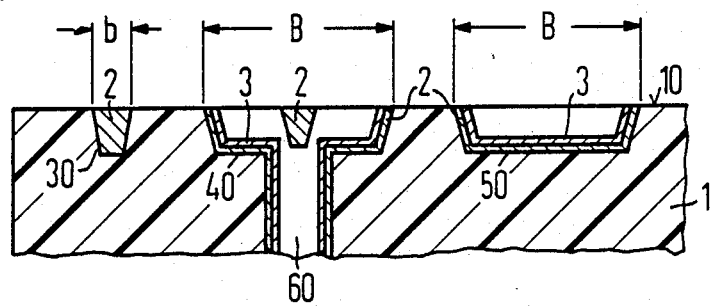
FIG. 1 is a cross sectional view of part of a printed circuit board in the form of an injected molded substrate having a geometry in accordance with the principles of the present invention.

FIG. 1 shows a cross sectional view of a substrate 1 composed of, for example, polyetherimide reinforced with glass fibers. During the injection molding process, V-shaped, trench-shaped depressions 30, having width b, and planar-shaped depressions 40, having a width B here produced in the substrate 1. The planar-shaped depressions 40, in the region of the through-connection holes 60 and the planar depressions 50, also having a width B, were also produced in the substrate 1 by the injection molding process. In FIG. 1, the trench shaped depressions 30 are completely filled, to the surface 10 of the substrate 1, with metal by the application of a metal coat 2. The trench-shaped depressions 30 can be filled by narrowly dimensioning them (b) which allows these depressions to be filled initially during the metal deposition at both the base and the side walls of the depression. Planar dimensions 40 and 50 are dimensioned with the width of B so that they will not be filled to the level of the substrate surface before the trench-shaped depressions. Thus, the metal coat 2 becomes planar in the depressions 40 and 50. Additionally, the metal coat is deposited with a low thickness so that there remains a distance, referenced A herein (see FIG. 1) from the metal coat to the surface 10 of the substrate 1. Therefore, even if the trench-shaped depressions 30 and the planar depressions 40 and 50 are the same depth, a metal deposition undertaken in the same bath, will extend up to the surface 10 of the substrate 1 in the trench-shaped depressions, but will remain a distance A from the surface 10 in the planar depressions 40 and 50. In any situation, the distance A must be such a magnitude so that a planar coating of a soldar stop lacquer of the surface 10 only covers the interconnect traces in the region of the trench-shaped depressions 30 and does not cover the solder eyes of the through connections in the region of the planar depressions 40 and the connecting pads in the region of the planar depressions 50. After solder stop lacquer (not seen in FIG. 1) has been applied, the areas of the metal layer 2, which serve as through-connections, and connection pads, can be coated with a tin layer 3 by hot tin-plating.

Figure 2:
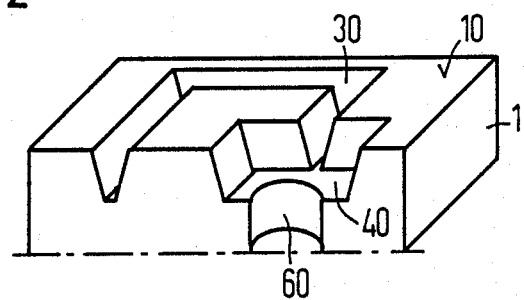
FIGS. 2–6 illustrate the method steps of the manufacture of the printed circuit board of the present invention, which is shown in FIG. 1.

FIG. 2 shows a part of the injection molded substrate 1, with the approximately V-shaped, trench-shaped depressions 30 corresponding to the interconnect traces. FIG. 2 also shows the planar depressions 40 and the through-connections 60 departing from the interconnect traces.

Figure 3:
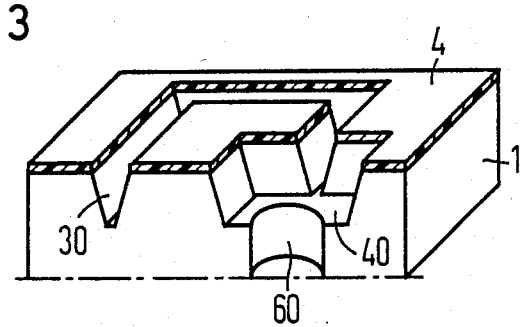

In FIG. 3, a lacquer layer 4 is applied to the surface 10 of the substrate 1 in a standard surface treatment, involving a standard plating resist. The application of the lacquer layer 4 occurs by roller coating, so that depressions 30 and 40 remain free as a consequence of the distance A, as described in connection with FIG. 1.

Figure 4:
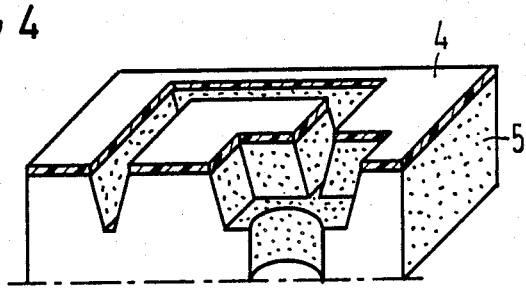

In FIG. 4 a nucleation 5 is applied. The nucleation 5 is indicated in the drawings by the fine dots. The application of this nucleation can occur by for example, immersing the substrate 1 into a $PdCl_2$-$SnCl_2$ bath. Once the nucleation 5 has been applied, it is activated, which involves a reducing or an acceleration that is standard in additive technology.

Figure 5:
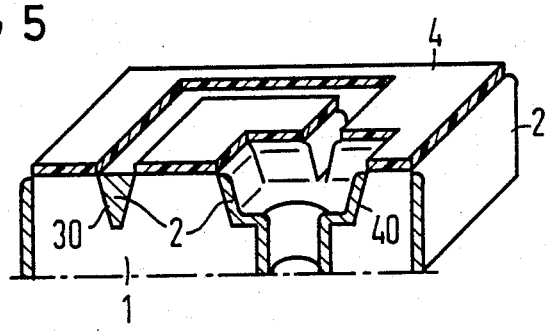

FIG. 5 shows a metal layer 2 that is applied to those regions which are not protected by a lacquer layer 4. The metal layer 2 is applied by chemical metal deposition which is free of external current. The figure shows a metal layer 2 applied in a commercially available, currentless copper bath has reached a thickness, by an appropriate dimensioning of the coating duration, so as to completely fill the trench-shaped depression 30 to the surface of the substrate 1.

Figure 6:
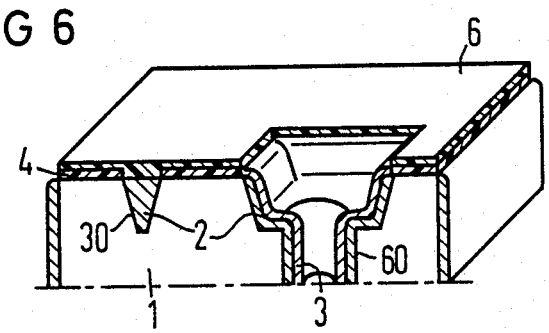

In FIG. 6, solder stop lacquer 6 is applied by roller coating. The solder stop layer 6 leaves the planar depressions 40 and through-connecting holes 60 free so that, in this figure, a tin layer 3 can be applied by hot-tinning. The lacquer layer 4 need not be removed before the application of the solder stop lacquer 6.

The term "printed circuit board", as well as the simplified drawings, refer to and show a planar structure. The advantages of injection molded substrates, and of photostructurings that are no longer required when applying a plating resist and a solder stop lacquer in a planar structure, can be done and achieved in the 3-dimensional printed circuit boards which have arbitrarily angled or curve shapes as well. It should be understood that various changes and modifications to the presently preferred embodiments described herein will be apparent to those skilled in the art. Such changes and modifications can be made without departing from the spirit and scope of the present invention without diminishing its attendant advantages. It is therefore intended that such changes and modifications be covered by the appended claims.

I claim my invention:

1. A printed circuit board comprising:
    an injection molded substrate having a surface;
    a pattern of interconnect traces, through-connections and connecting pads recessed in said substrate surface formed by trench-shaped depressions in the region of each interconnect trace and by planar depressions in at least one of (a) the region of each through-connection or (b) the region of each connecting pad; and
    said planar and trench-shaped depressions having a conductive metal coat, the width of each trench-shaped depression being dimensioned narrowly in comparison to the width of each planar depression so that said metal coat fills each trench-shaped depression to the surface of the substrate, and in each planar depression a distance remains between the metal coat and the surface of the substrate.

2. A printed circuit board as claimed in claim 1 further comprising a tin layer applied by hot-tinning covering said metal coat.

3. A printed circuit board as claimed in claim 1 wherein said metal coat consists of copper chemically applied to said substrate.

4. A printed circuit board as claimed in claim 1 wherein each trench-shaped depression has a V-shaped cross-section.

5. A method for manufacturing a circuit board comprising:

generating a pattern of recesses in a surface of a substrate by forming a trench-shaped depression in the region of each interconnect trace and by forming a planar depression in at least one of (a) the region of each through-connection or (b) the region of each connecting pad, with each trench-shaped depression being narrow in comparison to each planar depression; and applying a metal coat to said substrate so that said metal coat fills each trench-shaped depression to the surface of the substrate and in each planar depression a distance remains between said metal coat and said surface of said substrate.

6. A method as claimed in claim 5 comprising the additional step of:

covering said metal coat with a tin layer by hot-tinning.

7. A method is claimed in claim 5 wherein the step of applying said metal coat is further defined by chemically applying a copper coat to said substrate.

8. A printed circuit board comprising:

an injection molded substrate having a surface, the surface having a planar depression and a trench-shaped depression disposed therein, the trench-shaped depression having a metal coat to form an interconnect trace, the planar depression having a metal coat to form one of (a) a through-connection or (b) a connecting pad; the trench-shaped depression and the planar depression each having a width, the width of the planar depression being wider than the width of the trench-shaped depression so that when the metal coat is applied to the printed circuit board the metal coat fills the trench-shaped depression to the surface of the substrate while a distance remains between the metal coat and the surface of the substrate at the planar depression.

9. A printed circuit board as claimed in claim 8, further comprising a tin layer applied by hot-tinning covering the metal coat.

10. A printed circuit board as claimed in claim 8, wherein the metal coat comprises copper chemically applied to the substrate.

11. A printed circuit board as claimed in claim 8, where the trench-shaped depression has a V-shaved cross-section.

12. A method for manufacturing a circuit board from a substrate having a surface, the method comprising the steps of:

forming a trench-shaped depression in the substrate in the region of an interconnect trace that is to be placed on the circuit board;

forming a planar depression in the substrate in at least one of (a) the region of a through-connection that is to be disposed through the circuit board of (b) the region of a connecting pad that is to be placed on the circuit board, the trench-shaped depression being narrow in comparison to the planar depression; and applying a metal coat to the substrate so that the metal coat fills the trench-shaped depression to the surface of the substrate and in the planar depression a distance remains between the metal coat and the surface of the substrate.

13. A method as claimed in claim 12, further comprising the step of covering the metal coat with a tin layer by hot-tinning.

14. A method as claimed in claim 12, wherein the step of applying the metal coat is further defined by chemically applying a copper coat to the substrate to form the circuit board.

* * * * *